United States Patent
Nishimura et al.

(10) Patent No.: US 7,961,442 B2
(45) Date of Patent: Jun. 14, 2011

(54) TUNNELING MAGNETIC DETECTING ELEMENT HAVING INSULATION BARRIER LAYER AND METHOD FOR MAKING THE SAME

(75) Inventors: Kazumasa Nishimura, Niigata-ken (JP); Ryo Nakabayashi, Niigata-ken (JP); Naoya Hasegawa, Niigata-ken (JP); Masamichi Saito, Niigata-ken (JP); Yosuke Ide, Niigata-ken (JP); Masahiko Ishizone, Niigata-ken (JP)

(73) Assignee: TDK Corporation, Tokyo (JP)

( * ) Notice: Subject to any disclaimer, the term of this patent is extended or adjusted under 35 U.S.C. 154(b) by 861 days.

(21) Appl. No.: 11/947,315

(22) Filed: Nov. 29, 2007

(65) Prior Publication Data

US 2008/0182111 A1 Jul. 31, 2008

(30) Foreign Application Priority Data

Jan. 31, 2007 (JP) .................................. 2007-021069

(51) Int. Cl.
*G11B 5/39* (2006.01)

(52) U.S. Cl. ..................................................... 360/324.2

(58) Field of Classification Search ............... 360/324.1, 360/324.11, 324.12, 324.2
See application file for complete search history.

(56) References Cited

U.S. PATENT DOCUMENTS

| | | | |
|---|---|---|---|
| 6,756,128 B2 * | 6/2004 | Carey et al. ................. | 428/811.1 |
| 6,791,806 B1 * | 9/2004 | Gao et al. .................... | 360/324.2 |
| 7,183,893 B2 * | 2/2007 | Clifton et al. ............... | 338/32 R |
| 7,542,245 B2 * | 6/2009 | Kagami et al. ................ | 360/317 |
| 2002/0114112 A1 * | 8/2002 | Nakashio et al. .......... | 360/324.2 |
| 2007/0014054 A1 * | 1/2007 | Zhang et al. .............. | 360/324.12 |
| 2007/0171580 A1 * | 7/2007 | Nishimura et al. ........ | 360/324.2 |

FOREIGN PATENT DOCUMENTS

| | | |
|---|---|---|
| JP | 2000-508834 | 7/2000 |
| JP | 2003-204045 | 7/2003 |
| JP | 2005-520105 | 8/2006 |

* cited by examiner

*Primary Examiner* — Jefferson Evans
(74) *Attorney, Agent, or Firm* — Brinks Hofer Gilson & Lione (57) ABSTRACT

A tunneling magnetic detecting element includes an insulating barrier layer having a layered structure including a Ti—O sublayer and a Ta—O sublayer. The Ta concentration in the insulating barrier layer is set to be more than 0 at % but not more than about 7 at % with respect to a total of 100 at % of Ti and Ta constituting the insulating barrier layer.

11 Claims, 8 Drawing Sheets

TUNNELING MAGNETIC DETECTING ELEMENT HAVING INSULATION BARRIER LAYER AND METHOD FOR MAKING THE SAME

CLAIM OF PRIORITY

This application claims benefit of the Japanese Patent Application No. 2007-021069 filed on Jan. 31, 2007, the entire content of which is hereby incorporated by reference.

BACKGROUND OF THE INVENTION

1. Field of the Invention

The present invention relates to magnetic detecting elements that utilize a tunneling effect and are mounted on hard disk apparatuses and other magnetic detecting apparatuses. In particular, it relates to a tunneling magnetic detecting element in which the rate of change in resistance ($\Delta R/R$) is improved, and a method for making such a tunneling magnetic detecting element.

2. Description of the Related Art

A tunneling magnetoresistive element uses a tunneling effect to generate changes in resistance. The resistance peaks when the magnetization direction of the pinned magnetic layer and the magnetization direction of the free magnetic layer are antiparallel to each other. This is because the tunneling current does not smoothly flow due to an insulating barrier layer (tunneling barrier layer) formed between the pinned magnetic layer and the free magnetic layer. In contrast, the resistance is minimum when the magnetization direction of the pinned magnetic layer and the magnetization direction of the free magnetic layer are parallel to each other since the tunneling current smoothly flows under such a condition.

Under this principle, changes in electrical resistance caused by changes in magnetization direction of the free magnetic layer under application of external magnetic fields can be detected as changed in voltage, and this principle is now used to detect leakage magnetic fields from recording media.

In order to improve the rate of change in resistance ($\Delta R/R$) of a tunneling magnetic detecting element, for example, the material of the free magnetic layer in contact with the insulating barrier layer is changed from a material that has been used in the related art. For example, a free magnetic layer is formed to include a soft magnetic sublayer composed of Ni—Fe and an enhancing sublayer composed of Co—Fe and in contact with the insulating barrier layer while being disposed between the soft magnetic layer and the insulating barrier layer. The rate of change in resistance ($\Delta R/R$) can be increased by increasing the Fe concentration in Co—Fe constituting the enhancing layer.

However, increasing the Fe concentration in the enhancing layer increases the magnetostriction of the free magnetic layer and degrades operation stability, which has been a problem.

Thus, it is now desired to increase the rate of change in resistance ($\Delta R/R$) without changing the configuration of the free magnetic layer or the pinned magnetic layer. PCT Japanese Translation Patent Publication No. 2000-508834 and Japanese Unexamined Patent Application Publication Nos. 2006-520105 and 2003-204045 each disclose a tunneling magnetic detecting element and the material of the insulating barrier layer.

However, none of the patent documents described above discloses a structure that achieves an increased rate of change in resistance ($\Delta R/R$) without changing the configuration of the free magnetic layer or the pinned magnetic layer.

SUMMARY

A first aspect of the present invention provides a tunneling magnetic detecting element including a first magnetic layer, an insulating barrier layer on the first magnetic layer, and a second magnetic layer on the insulating barrier layer. The first magnetic layer, the insulting barrier layer, and the second magnetic layer are stacked in that order from the bottom. One of the first magnetic layer and the second magnetic layer functions as a pinned magnetic layer having magnetization pinned in one direction and the other of the first magnetic layer and the second magnetic layer functions as a free magnetic layer having magnetization direction changing in response to an external magnetic field. The insulating barrier layer is composed of Ti—Ta—O. The Ta concentration in the barrier layer is more than 0 at % but not more than about 7 at % with respect to a total of 100 at % of Ti and Ta constituting the insulating barrier layer.

With this structure, the rate of change in resistance ($\Delta R/R$) can be increased compared to the existing art without changing the configuration of the pinned magnetic layer or the free magnetic layer.

Another aspect of the present invention provides a method for making a tunneling magnetic detecting element, including the steps of (a) forming a layered structure on a first magnetic layer, the layered structure including at least one titanium layer and at least one tantalum layer, such that a ratio of a thickness of the tantalum layer to a total thickness of the layered structure is more than 0% but not more than about 7.14%, the total thickness of the layered structure being a sum of an average thickness of the Ta layer (or a total of average thicknesses of the Ta layers when two or more Ta layers are provided) and an average thickness of the Ti layer (or a total of average thicknesses of the Ti layers when two or more Ti layers are provided); (b) forming an insulating barrier layer composed of Ti—Ta—O by oxidizing the at least one Ti layer and the at least one Ta layer; and (c) forming a second magnetic layer on the insulating barrier layer.

According to this process, a tunneling magnetic detecting element that has a higher rate of change in resistance ($\Delta R/R$) than the existing technology can be adequately and easily fabricated without changing the configurations of the pinned magnetic layer or the free magnetic layer from that of the existing technology.

According to the tunneling magnetic detecting element of the present invention, the rate of change in resistance ($\Delta R/R$) can be increased from the level of the existing technology without changing the configurations of the pinned magnetic layer or the free magnetic layer from the existing technology.

DESCRIPTION OF THE EMBODIMENTS

Figure 1:
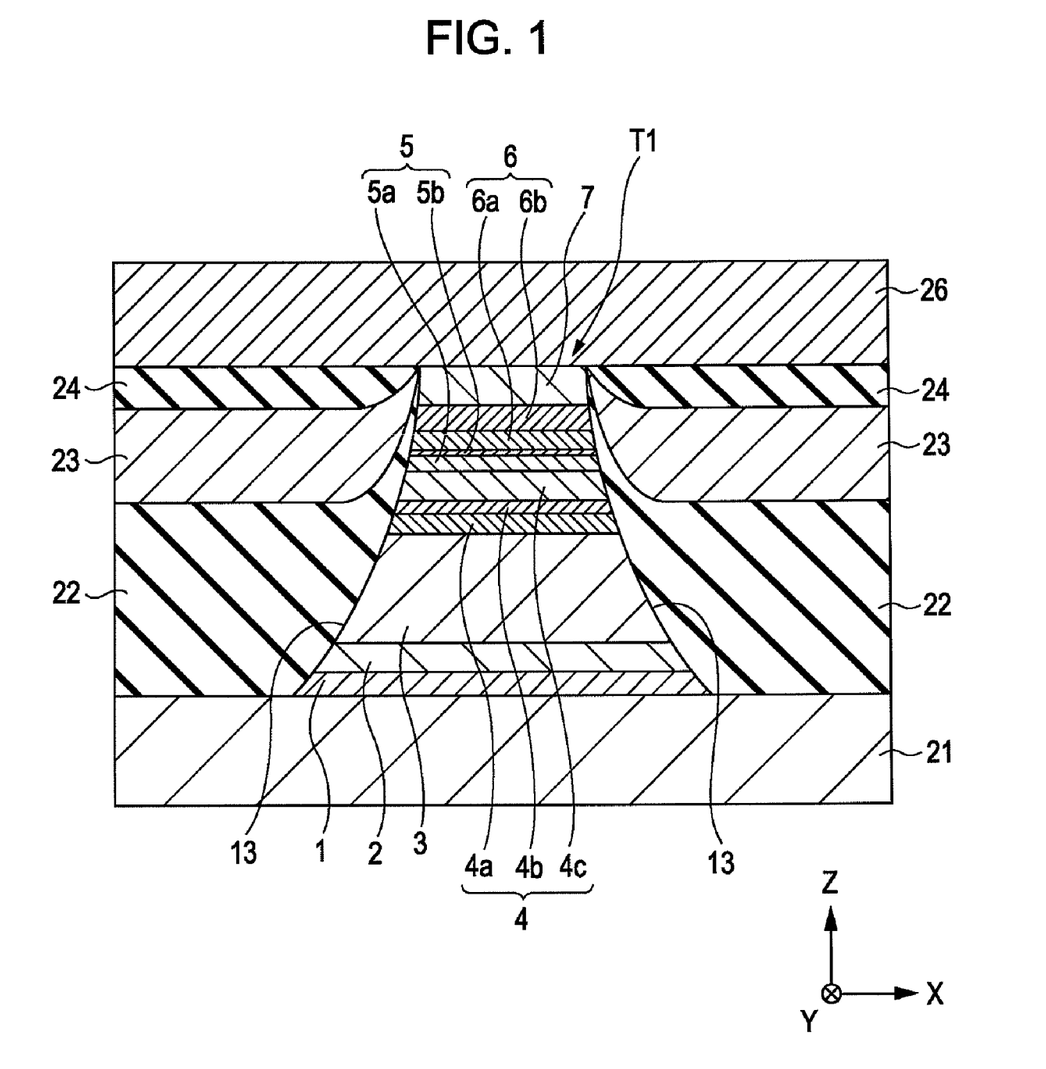
FIG. 1 is a cross-sectional view of a tunneling magnetic detecting element of a first embodiment, the cross-sectional view taken along a plane parallel to a surface of the tunneling magnetic detecting element opposing a recording medium.

FIG. 1 is a cross-sectional view of a tunneling magnetic detecting element (tunneling magnetoresistive element) according to one embodiment of the present disclosure. The cross-sectional view is taken along a plane parallel to a surface opposing a recording medium.

The tunneling magnetic detecting element is typically mounted on a trailing end portion of a floating slider of a hard disk apparatus and is used to detect magnetic fields recorded on a magnetic recording medium. Note that, in the drawing, the X direction indicates the track width direction, the Y direction indicates the direction (height direction) of the leakage magnetic fields from the magnetic recording medium, and the Z direction indicates the direction of movement of the magnetic recording medium and the direction in which the individual layers of the tunneling magnetic detecting element are stacked.

The bottom layer in FIG. 1 is a lower shielding layer 21 composed of, for example, a NiFe alloy. A layered structure T1 is formed on the lower shielding layer 21. The tunneling magnetic detecting element is constituted from the layered structure T1, and lower insulating layers 22, hard bias layers 23, and upper insulating layers 24 formed on both sides of the layered structure T1 in the track width direction (X direction in the drawing).

The bottommost layer of the layered structure T1 is an underlayer 1 composed of a nonmagnetic metal material such as at least one element selected from Ta, Hf, Nb, Zr, Ti, Mo, and W. A seed layer 2 is disposed on the underlayer 1. The seed layer 2 is composed of Ni—Fe—Cr or Cr. When the seed layer 2 is composed of Ni—Fe—Cr, the seed layer 2 takes a face centered cubic (fcc) structure and equivalent crystal faces represented by {111} are preferentially oriented in a plane parallel to the layer surface. When the seed layer 2 is composed of Cr, the seed layer 2 takes a body centered cubic (bcc) structure and equivalent crystal faces represented by {111} are preferentially oriented in a plane parallel to the layer surface. However, the underlayer 1 need not be provided.

An antiferromagnetic layer 3 formed on the seed layer 2 is preferably composed of an antiferromagnetic material containing element $\alpha$ (wherein $\alpha$ is at least one element selected from the group consisting of Pt, Pd, Ir, Rh, Ru, and Os) and Mn.

An $\alpha$-Mn alloy containing a platinum-group element has superior characteristics as an antiferromagnetic material, e.g., excellent corrosion resistance and a high blocking temperature, and can increase the exchange coupling magnetic field (Hex).

Alternatively, the antiferromagnetic layer 3 may be composed of an antiferromagnetic material containing the element $\alpha$, an element $\alpha'$ (wherein $\alpha'$ is at least one element selected from Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements), and Mn.

For example, the antiferromagnetic layer 3 is composed of Ir—Mn.

A pinned magnetic layer (first magnetic layer) 4 is disposed on the antiferromagnetic layer 3. The pinned magnetic layer 4 has a laminated ferrimagnetic structure including a first pinned magnetic sublayer 4a at the bottom, a nonmagnetic intermediate sublayer 4b on the first pinned magnetic sublayer 4a, and a second pinned magnetic sublayer 4c on the nonmagnetic intermediate sublayer 4b. The magnetization directions of the first pinned magnetic sublayer 4a and the second pinned magnetic sublayer 4c are oriented antiparallel to each other by the exchange coupling magnetic field (Hex) at the interface between the pinned magnetic layer 4 and the antiferromagnetic layer 3 and by the antiferromagnetic exchange coupling magnetic field (Ruderman-Kittel-Kasuya-Yoshida (RKKY) interaction) generated by the interposition of the nonmagnetic intermediate sublayer 4b. This structure is generally referred to as "layered ferrimagnetic structure". With this structure, the magnetization of the pinned magnetic layer 4 can be stabilized, and the apparent intensity of the exchange coupling magnetic field generated at the interface between the pinned magnetic layer 4 and the antiferromagnetic layer 3 can be increased. The first pinned magnetic sublayer 4a and the second pinned magnetic sublayer 4c may have a thickness of about 12 to about 24 Å and the nonmagnetic intermediate sublayer 4b may have a thickness of about 8 to about 10 Å, for example.

The first pinned magnetic sublayer 4a and the second pinned magnetic sublayer 4c are composed of a ferromagnetic material, e.g., Co—Fe, Ni—Fe, or Co—Fe—Ni. The nonmagnetic intermediate sublayer 4b is composed of a nonmagnetic metal material such as Ru, Rh, Ir, Cr, Re, or Cu.

An insulating barrier layer 5 disposed on the pinned magnetic layer 4 is composed of titanium tantalum oxide (Ti—Ta—O).

A free magnetic layer (second magnetic layer) 6 is disposed on the insulating barrier layer 5. The free magnetic layer 6 includes a soft magnetic sublayer 6b composed of a soft magnetic material, e.g., a Ni—Fe alloy, and an enhancing sublayer 6a formed between the soft magnetic sublayer 6b and the insulating barrier layer 5 and composed of, for example, Co—Fe. The enhancing sublayer 6a is in contact with the insulating barrier layer 5. The soft magnetic sublayer 6b is preferably composed of a magnetic material with superior soft magnetic properties, e.g., a lower coercive force and a lower anisotropy magnetic field than the enhancing sublayer 6a. The enhancing sublayer 6a is preferably composed of a magnetic material having a larger spin polarization than the soft magnetic sublayer 6b. When the enhancing sublayer 6a is composed of a magnetic material, such as Co—Fe, having a large spin polarization, the rate of change in resistance ($\Delta R/R$) can be improved. The Fe concentration in Co—Fe constituting the enhancing sublayer 6a is preferably in the range of about 30 to about 100 at %. The Ni concentration in Ni—Fe constituting the soft magnetic sublayer 6b is preferably in the range of about 80.0 to about 95.0 at %.

The free magnetic layer 6 may have a layered ferrimagnetic structure in which magnetic sublayers and nonmagnetic sublayers are alternately stacked. The length of the free magnetic layer 6 in the track width direction (X direction in the drawing) defines the track width Tw.

A protective layer 7 is composed of Ta or the like is disposed on the free magnetic layer 6.

Side surfaces 13 of the layered structure T1 in the track width direction (X direction in the drawing) are sloped such that the length of the layered structure T1 in the track width direction gradually decreases toward the top.

As shown in FIG. 1, the lower insulating layers 22 are formed on the lower shielding layer 21 and cover the side surfaces 13 of the layered structure T1. The hard bias layers 23 are formed on the lower insulating layers 22, and the upper insulating layers 24 are formed on the hard bias layers 23.

Alternatively, bias underlayers (not shown) may be formed between the lower insulating layers 22 and the hard bias layers 23. The bias underlayers may be composed of Cr, W, or Ti, for example.

The lower insulating layers 22 and the upper insulating layers 24 are composed of an insulating material such as $Al_2O_3$ or $SiO_2$. The layers 22 and 24 are provided above and under the hard bias layers 23 to isolate the hard bias layers 23 so that the current flowing in the layered structure T1 in a direction perpendicular to the interfaces of the layers is prevented from shunting in the track width direction, i.e., the negative X direction and the positive X direction in the drawing. The hard bias layers 23 are composed of, for example, a cobalt-platinum alloy or a cobalt-chromium-platinum alloy.

An upper shielding layer 26 composed of a Ni—Fe alloy or the like is disposed on the layered structure T1 and the upper insulating layers 24.

In the embodiment shown in FIG. 1, the lower shielding layer 21 and the upper shielding layer 26 function as electrode layers of the layered structure T1, and the electrical current flows in a direction perpendicular to the surfaces of the layers of the layered structure T1, i.e., along the axis of the Z direction.

The free magnetic layer 6 is magnetized in a direction parallel to the track width direction (X direction in the drawing) by application of a bias magnetic field from the hard bias layers 23. The first pinned magnetic sublayer 4a and the second pinned magnetic sublayer 4c of the pinned magnetic layer 4 are magnetized in directions parallel to the height direction (Y direction in the drawing). Since the pinned magnetic layer 4 has a layered ferrimagnetic structure, the first pinned magnetic sublayer 4a and the second pinned magnetic sublayer 4c are magnetized in directions antiparallel to each other. The magnetization direction of the pinned magnetic layer 4 is pinned, i.e., it remains unchanged even under application of an external magnetic field; however, the magnetization direction of the free magnetic layer 6 can change in response to an external magnetic field.

When the magnetization direction of the free magnetic layer 6 changes in response to an external magnetic field and the second pinned magnetic sublayer 4c and the free magnetic layer 6 are magnetized antiparallel to each other, a tunneling current cannot smoothly flow via the insulating barrier layer 5 between the second pinned magnetic sublayer 4c and the free magnetic layer 6 and the resistance thus becomes maximum. In contrast, when the magnetization direction of the second pinned magnetic sublayer 4c is parallel to that of the free magnetic layer 6, the tunneling current can smoothly flow and the resistance thus becomes minimum.

Under this principle, the change in electrical resulting from changes in magnetization direction of the free magnetic layer 6 under application of the external magnetic field can be detected as a change in voltage, and thus the leakage magnetic field from the recording medium can be detected.

The features of the embodiment shown in FIG. 1 are that the insulating barrier layer 5 is composed of Ti—Ta—O and that the Ta concentration is more than 0 at % but not more than about 7 at % with respect to a total of 100 at % of Ti and Ta constituting the insulating barrier layer 5.

According to these features, the rate of change in resistance ($\Delta R/R$) can be increased without changing the configuration of the pinned magnetic layer 4 or the free magnetic layer 6.

In this embodiment, the insulating barrier layer 5 is composed of Ti—Ta—O, but the Ta concentration is not high. By setting the Ta concentration in the range of more than 0 at % but not more than 7 at %, a higher rate of change in resistance ($\Delta R/R$) can be achieved while maintaining RA (element resistance R×area A) substantially equal to the existing element.

The configuration of the insulating barrier layer 5 will now be described.

The insulating barrier layer 5 has a layered structure such as one shown in FIG. 1. In FIG. 1, a tantalum oxide (Ta—O) sublayer 5b is stacked on a titanium oxide (Ti—O) sublayer 5a.

As shown in the drawing, the Ti—O sublayer 5a is thicker than the Ta—O sublayer 5b. The thicknesses of the Ti—O sublayer 5a and the Ta—O sublayer 5b are adjusted such that the Ta concentration is more than 0 at % but not more than about 7 at % with respect to a total of 100 at % of Ti and Ta constituting the insulating barrier layer 5.

The total thickness of the insulating barrier layer 5 is about 5 to about 10 Å. The average thickness of the Ta—O sublayer 5b is very small and is about 0.2 to about 2 Å.

Figure 2:
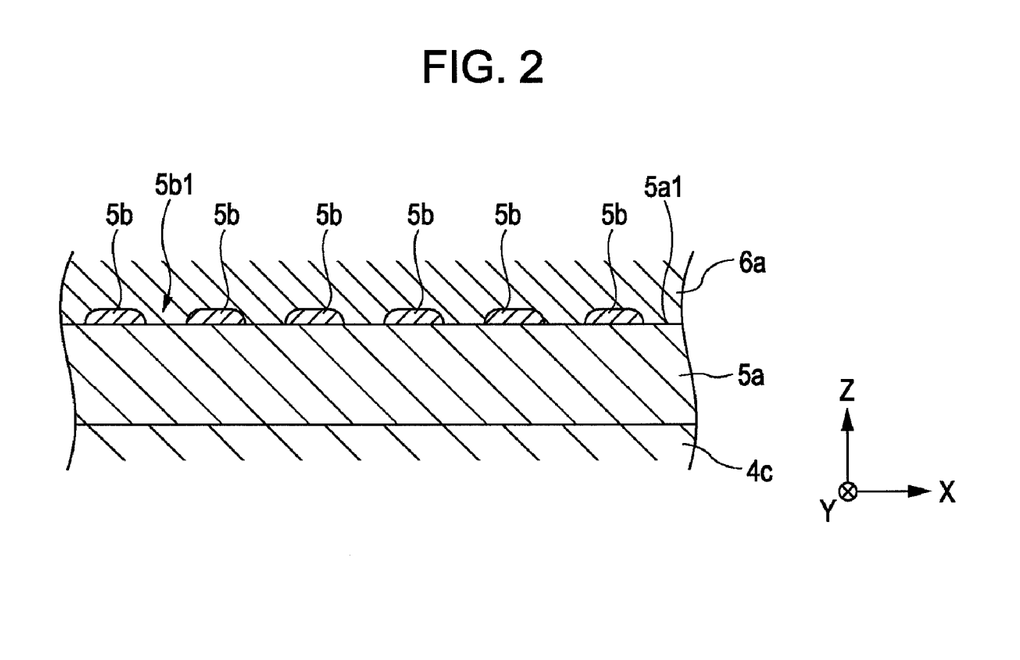
FIG. 2 is an enlarged partial cross-sectional view showing a structure of an insulating barrier layer according to the first embodiment.

Because of this, the Ta—O sublayer 5b is intermittently formed on an upper surface (forming face) 5a1 of the Ti—O sublayer 5a, as shown in FIG. 2. In other words, pinholes 5b1 are formed in the Ta—O sublayer 5b. It should be noted here that the average thickness of the Ta—O sublayer 5b means the thickness of the Ta—O sublayer 5b evened out over the entire surface of the Ti—O sublayer 5a. Therefore, the "average thickness" is defined by taking into account the pinholes 5b1 where the Ta—O sublayer 5b is absent on the Ti—O sublayer 5a.

As shown in this embodiment, the rate of change in resistance ($\Delta R/R$) can be increased by making the insulating barrier layer 5 with Ti—Ta—O. This is presumably because the wettability of the upper surface of the insulating barrier layer 5 is changed and thus the flatness and the crystal orientation of the enhancing sublayer 6a formed on the insulating barrier layer 5 are improved. Another conceivable reason is that incorporation of Ta in the insulating barrier layer 5 decreases oxygen diffusion from the insulating barrier layer 5 into the pinned magnetic layer 4 or free magnetic layer 6.

Figure 3:
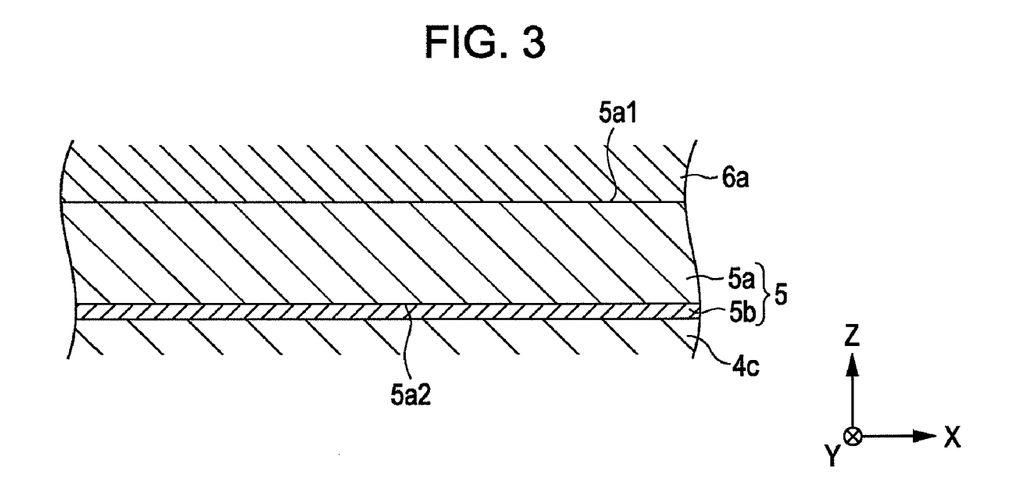
FIG. 3 is an enlarged partial cross-sectional view showing a structure of an insulating barrier layer according to a second embodiment.

Alternatively, as shown in FIG. 3, the Ta—O sublayer 5b may be formed on a lower surface 5a2 of the Ti—O sublayer 5a. In such a case, the surface (forming face) on which the Ta—O sublayer is formed is the upper surface of the second pinned magnetic sublayer 4c. Yet alternatively, the Ta—O sublayers 5b may be formed on both the upper surface 5a1 and the lower surface 5a2.

Figure 4:
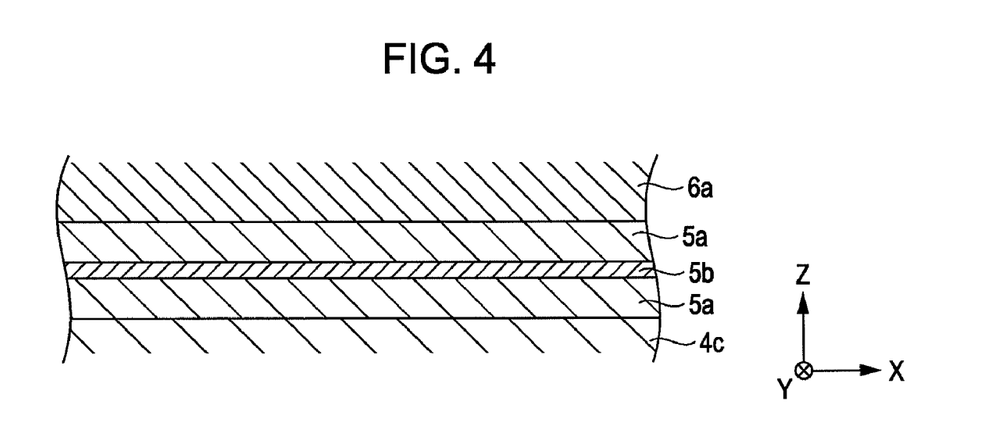
FIG. 4 is an enlarged partial cross-sectional view showing a structure of an insulating barrier layer according to a third embodiment.

Alternatively, the Ta—O sublayer 5b may be formed inside the Ti—O sublayer 5a, as shown in FIG. 4. In other words, according to the structure shown in FIG. 4, the insulating barrier layer 5 has a layered structure including Ti—O sublayer 5a/Ta—O sublayer 5b/Ti—O sublayer 5a.

In this embodiment, the Ta—O sublayer 5b is formed on at least one selected from the upper surface 5a1 of the Ti—O sublayer 5a, inside the Ti—O sublayer 5a, and the lower surface 5a2.

It is considered that Ta contained in the Ta—O sublayer 5b has an effect of suppressing oxygen diffusion into the pinned magnetic layer 4 or the free magnetic layer 6. Accordingly, it is preferable to form the Ta—O sublayer 5b on one or both of the upper surface 5a1 of the insulating barrier layer 5 and the lower surface 5a2 of the insulating barrier layer 5.

The tunneling magnetic detecting element shown in FIG. 1 is of a bottom type in which the pinned magnetic layer 4, the insulating barrier layer 5, and the free magnetic layer 6 are sequentially stacked from the bottom. According to the bottom-type tunneling magnetic detecting element, it is effective to stack the Ti—O sublayer 5a, the Ta—O sublayer 5b, and the enhancing sublayer 6a in that order from the bottom to increase the crystal orientation of the Ti—O sublayer 5a.

Figure 5:
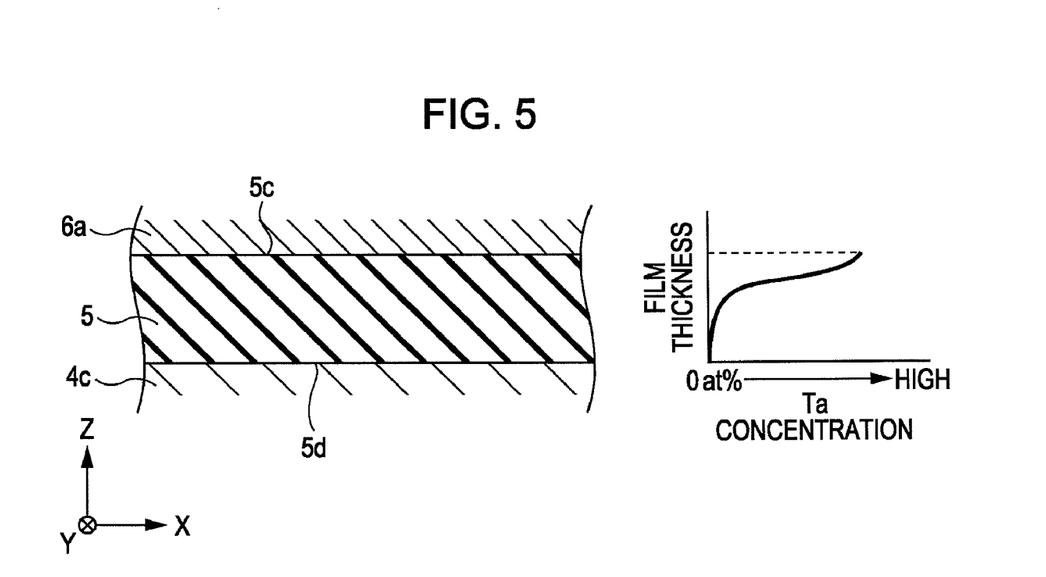
FIG. 5 includes an enlarged partial cross-sectional view showing a structure of an insulating barrier layer according to a fourth embodiment and a graph showing a Ta concentration gradient.

Alternatively, as shown in FIG. 5, a Ta content gradient region may be provided in the insulating barrier layer 5 in the thickness direction (Z direction in the drawing). In other words, according to the modification shown in FIG. 5, the interface between the Ti—O sublayer 5a and the Ta—O sublayer 5b is not clear and interdiffusion of Ti and Ta occurs so that these sublayers function as single layer. As a result, a region with a Ta content gradient is formed inside the insulating barrier layer 5. In practice, Ta and Ti easily diffuse by annealing or the like and a content gradient region is easily formed.

The graph shown on the right-hand side of FIG. 5 has the abscissa indicating the Ta concentration and the ordinate indicating the positional relationship with respect to the thickness of the insulating barrier layer 5. The curve plotted in the graph shows the change in Ta concentration. In the modification shown in FIG. 5, the Ta concentration is highest near the upper surface 5c of the insulating barrier layer 5 and gradually decreases toward a lower surface 5d.

The Ta concentration gradient curve is not limited to one shown in the graph of FIG. 5. For example, the Ta concentration may be adjusted so that the concentration peaks near the center of the insulating barrier layer 5 in the thickness direction. Alternatively, Ta may be diffused only near the upper surface 5c, for example, instead of being diffused into the entirety of the insulating barrier layer 5 such that the portion of the insulating barrier layer 5 from the center of the layer to the lower surface 5d is composed of Ti—O only.

Alternatively, the insulating barrier layer 5 may be formed by oxidizing a Ti—Ta alloy layer. In this case, it is considered that no Ta concentration gradient region exists in the insulating barrier layer 5 but Ti and Ta are homogeneously mixed in the layer.

In this embodiment, the Ta concentration is preferably about 1.85 at % or more and about 5.34 at % or less with respect to a total of 100 at % of Ti and Ta constituting the insulating barrier layer 5. Within this range, a rate of change in resistance (ΔR/R) higher than that of the existing technology can be achieved. Moreover, the variation in RA before and after the heating can be reduced when compared with the existing technology.

In the embodiment shown in FIG. 1, the antiferromagnetic layer 3, the pinned magnetic layer 4, the insulating barrier layer 5, and the free magnetic layer 6 are sequentially stacked in that order from the bottom. Alternatively, the free magnetic layer 6, the insulating barrier layer 5, the pinned magnetic layer 4, and the antiferromagnetic layer 3 may be stacked in that order from the bottom.

Alternatively, the tunneling magnetic detecting element may be of a dual type in which a lower antiferromagnetic layer, a lower pinned magnetic layer, a lower insulating barrier layer, a free magnetic layer, an upper insulating barrier layer, an upper pinned magnetic layer, and an upper antiferromagnetic layer are sequentially stacked in that order from the bottom. In such a case, the lower insulating barrier layer and the upper insulating barrier layer are made of Ti—Ta—O described in this embodiment.

A method for making a tunneling magnetic detecting element of this embodiment will now be described. FIGS. 6 to 9 are partial cross-sectional views of a tunneling magnetic detecting element in the course of production and are taken at the same position as in FIG. 1.

Figure 6:
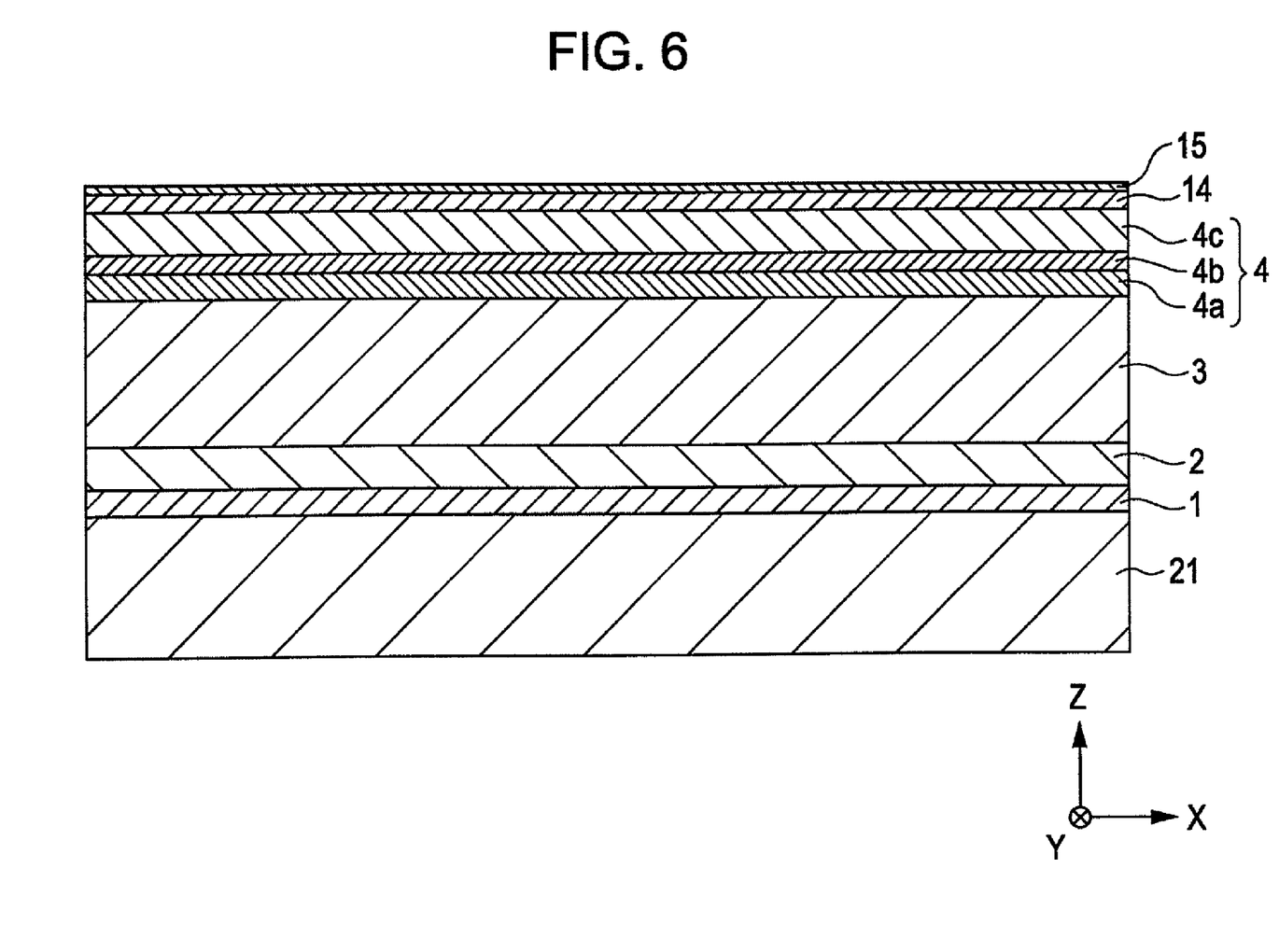
FIG. 6 is a step diagram showing a method for making a tunneling magnetic detecting element (cross-sectional view of the tunneling magnetic detecting element in the course of production, the cross-sectional view being taken along a plane parallel to a surface of the tunneling magnetic detecting element opposing a recording medium) according to the embodiment.

In the step shown in FIG. 6, the underlayer 1, the seed layer 2, the antiferromagnetic layer 3, the first pinned magnetic sublayer 4a, the nonmagnetic intermediate sublayer 4b, and the second pinned magnetic sublayer 4c are sequentially and continuously deposited on the lower shielding layer 21.

Then a titanium layer 14 is formed on the second pinned magnetic sublayer 4c by sputtering or the like. A tantalum layer 15 is then formed on the titanium layer 14 by sputtering or the like.

In this embodiment, the ratio of the thickness of the tantalum layer 15 to the thickness of a layered structure including the tantalum layer 15 and the titanium layer 14, i.e., the total of the average thickness of the tantalum layer 15 and the average thickness of the titanium layer 14, is set to more than 0% but not more than about 7.14%.

Preferably, the ratio of the thickness of the tantalum layer 15 to the total thickness of the layered structure including the tantalum layer 15 and the titanium layer 14 is set in the range of about 1.89% or more and about 5.45% or less in this embodiment.

In this embodiment, the thickness of the layered structure including the tantalum layer 15 and the titanium layer 14, i.e., the sum of the average thickness of the titanium layer 14 and the average thickness of the tantalum layer 15, is set in the range of about 4 to about 7 Å. The tantalum layer 15 is formed to have an average thickness of more than 0 Å and less than about 0.4 Å, preferably about 0.1 Å or more and about 0.3 Å or less. Since the tantalum layer 15 is extremely thin as such, the tantalum layer 15 is intermittently formed on the titanium layer 14.

Next, oxygen is introduced into the vacuum chamber. As a result, the titanium layer 14 and the tantalum layer 15 are completely oxidized, and the insulating barrier layer 5 including the Ti—O sublayer 5a and the Ta—O sublayer 5b is formed as a result. At this stage, the Ta concentration in the insulating barrier layer 5 is more than 0 at % but not more than about 7 at % and preferably in the range of about 1.85 at % to about 5.34 at % with respect to a total of 100 at % of Ti and Ta.

It should be noted here that the Ta density and the Ti density used in conversion from the thickness ratio to the concentration ratio are 16.65 (g/cm$^3$) and 4.5 (g/cm$^3$), respectively.

Figure 7:
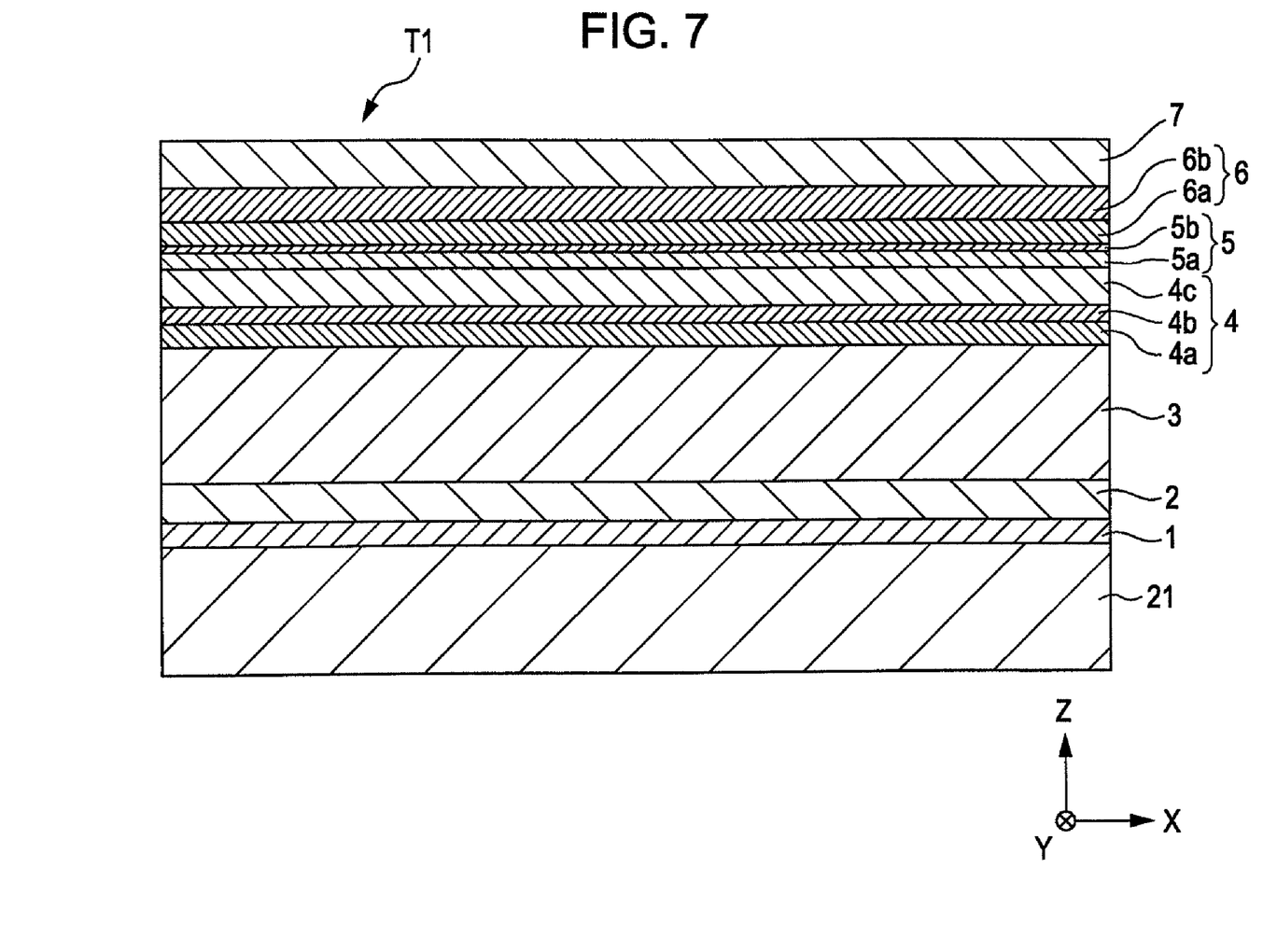
FIG. 7 is a step diagram showing a step subsequent to the step shown in FIG. 6 (cross-sectional view of the tunneling magnetic detecting element in the course of production, the cross-sectional view being taken along a plane parallel to a surface of the tunneling magnetic detecting element opposing a recording medium)

Next, as shown in FIG. 7, the free magnetic layer 6 including the enhancing sublayer 6a composed of, e.g., Co—Fe and the soft magnetic sublayer 6b composed of, e.g., Ni—Fe and the protective layer 7 are deposited on the insulating barrier layer 5. The layers from the underlayer 1 to the protective layer 7 form the layered structure T1.

Figure 8:
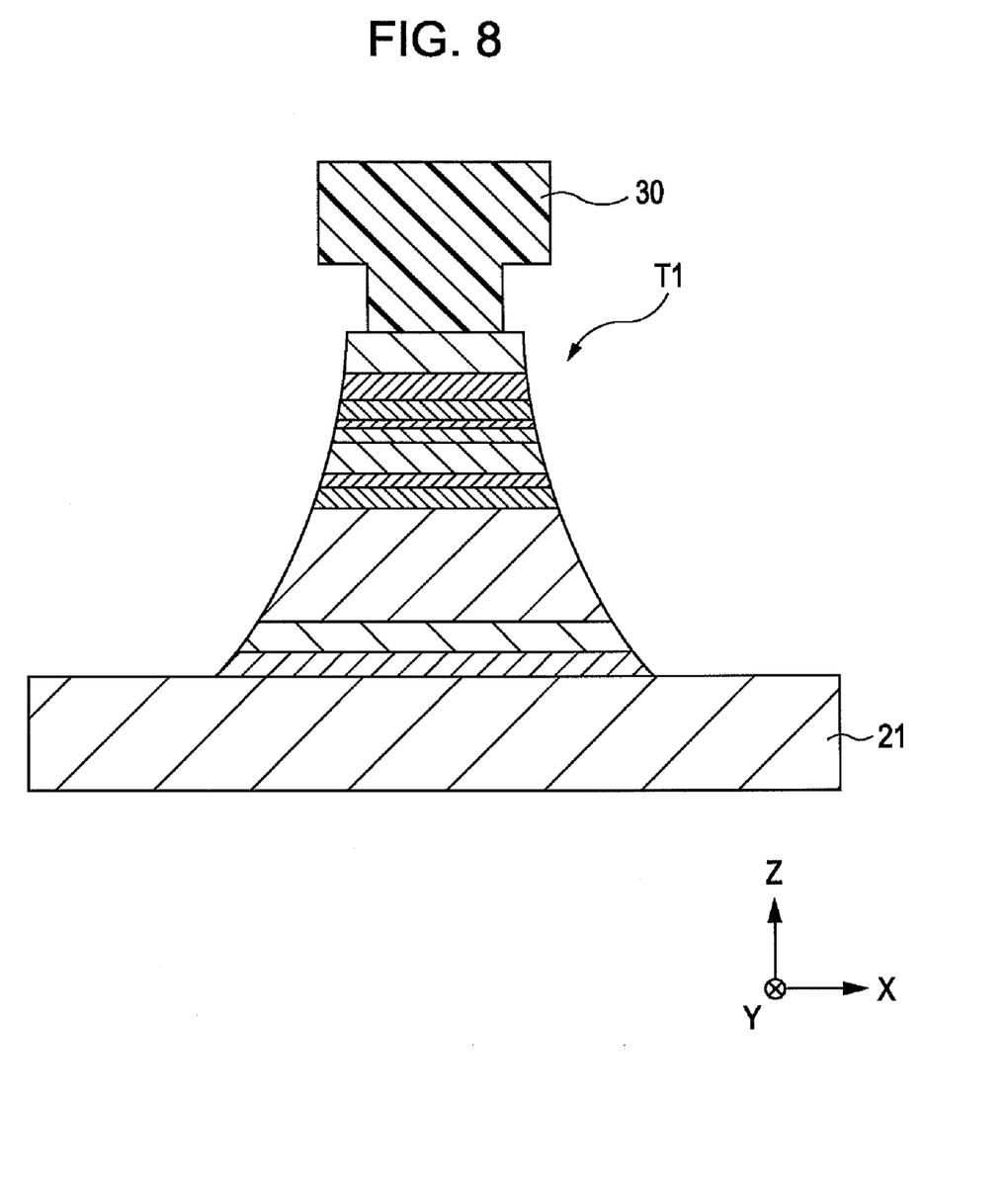
FIG. 8 is a step diagram showing a step subsequent to the step shown in FIG. 7 (cross-sectional view of the tunneling magnetic detecting element in the course of production, the cross-sectional view being taken along a plane parallel to a surface of the tunneling magnetic detecting element opposing a recording medium)

Referring now to FIG. 8, a lift-off resist layer 30 is formed on the layered structure T1, and side portions (X direction in the drawing) of the layered structure T1 not covered with the lift-off resist layer 30 are removed by etching or the like.

Figure 9:
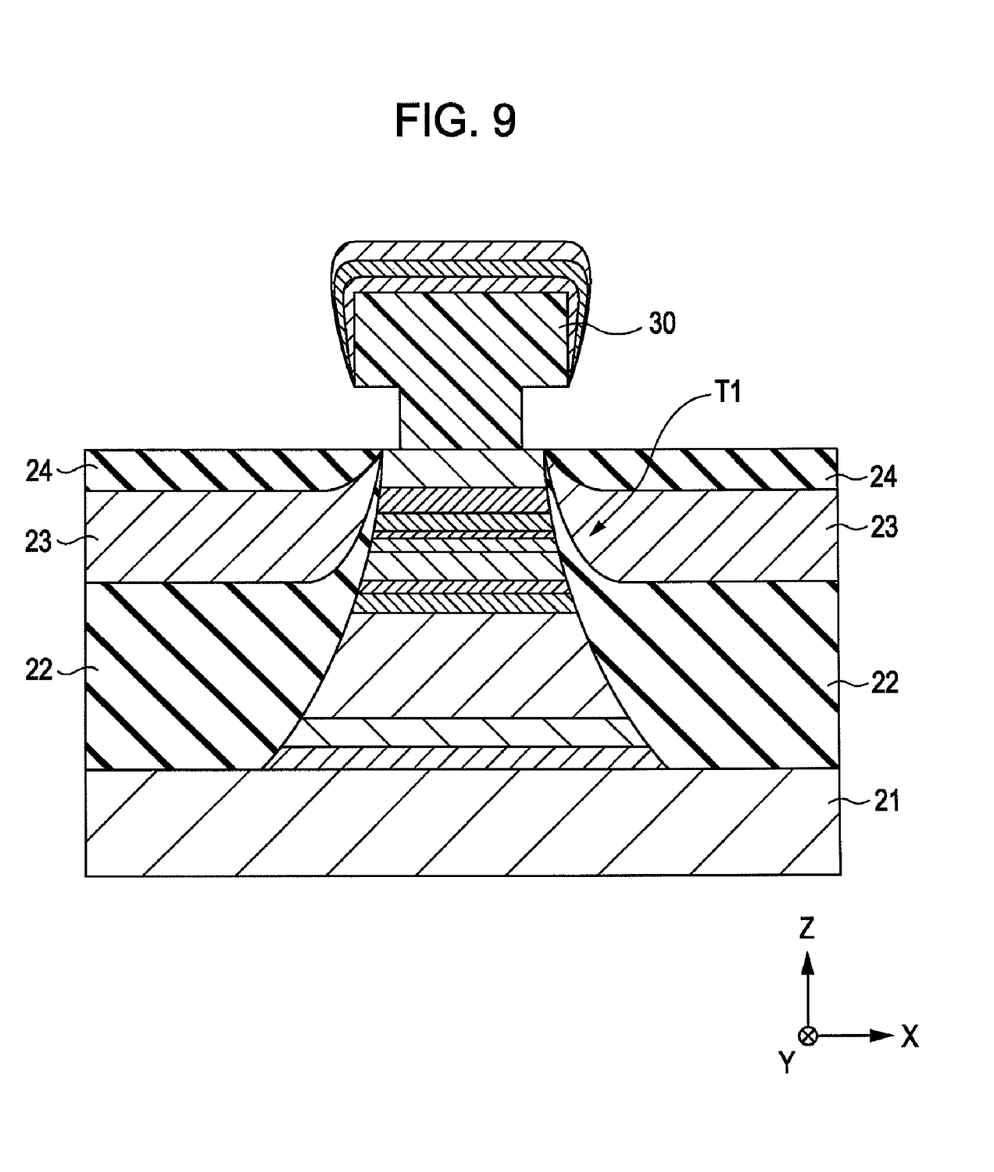
FIG. 9 is a step diagram showing a step subsequent to the step shown in FIG. 8 (cross-sectional view of the tunneling magnetic detecting element in the course of production, the cross-sectional view being taken along a plane parallel to a surface of the tunneling magnetic detecting element opposing a recording medium)

As shown in FIG. 9, the lower insulating layers 22, the hard bias layers 23, and the upper insulating layer 24 are sequentially deposited in that order on portions of the lower shielding layer 21 at the both sides of the layered structure T1 in the track width direction (X direction).

The lift-off resist layer 30 is then removed, and the upper shielding layer 26 is formed on the layered structure T1 and the upper insulating layers 24.

The method of making the tunneling magnetic detecting element described above includes a step of annealing. Representative example of the annealing step is annealing for generating an exchange coupling magnetic field (Hex) between the antiferromagnetic layer 3 and the pinned magnetic layer 4.

When annealing is conducted at about 240° C. to about 310° C. for several hours, Ti and Ta constituting the insulating barrier layer 5 diffuse and a Ta concentration gradient region is readily formed. In the tunneling magnetic detecting element formed through the steps shown in FIGS. 6 to 9, a concentration gradient region in which the Ta concentration gradually increases from the lower surface 5d-side toward the upper surface 5c of the insulating barrier layer 5 is easily formed.

In the method for making the tunneling magnetic detecting element described above, the tantalum layer 15 is formed on the titanium layer 14 in the step shown in FIG. 6. However, the layer configuration is not particularly limited. For example, a tantalum layer 15/titanium layer 14 layer configuration, a tantalum layer 15/titanium layer 14/tantalum layer 15 configuration, a titanium layer 14/tantalum layer 15/titanium layer 14 configuration (orders of layers are from the bottom), or the like can be employed.

In the step shown in FIG. 6, a Ti—Ta alloy layer may be formed on the second pinned magnetic sublayer 4c and oxidized. In this manner, an insulating barrier layer 5 composed of Ti—Ta—O can be formed. In this case, the Ta concentration in the Ti—Ta alloy layer is adjusted in advance in the range of more than 0 at % but not more than about 7 at %.

Examples of the method of oxidation include radical oxidation, ion oxidation, plasma oxidation, and natural oxidation. The radical oxidation time is, for example, 100 to 300 seconds.

Instead of forming the insulating barrier layer 5 composed of Ti—Ta—O by depositing and oxidizing the titanium layer 14 and the tantalum layer 15, a target composed of Ti—Ta—O may be used to form the insulating barrier layer 5 by sputtering. In such a case, the Ta concentration in the target is set to more than 0 at % but not more than about 7 at % with respect to a total of 100 at % of the Ti and Ta.

A single-type tunneling magnetic detecting element in which the free magnetic layer 6, the insulating barrier layer 5, the pinned magnetic layer 4, and the antiferromagnetic layer 3 are stacked in that order from the bottom and a dual-type tunneling magnetic detecting element can be fabricated by a method similar to the process described with reference to FIGS. 6 to 9.

EXAMPLES

A tunneling magnetic detecting element shown in FIG. 1 was fabricated.

An underlayer 1 composed of Ta (30), a seed layer 2 composed of Ni$_{49\,at\%}$Fe$_{12\,at\%}$Cr$_{39\,at\%}$(50), an antiferromagnetic layer 3 composed of Ir$_{26\,at\%}$Mn$_{74\,at\%}$(70), a pinned magnetic layer 4 [first pinned magnetic sublayer 4a composed of Co$_{70\,at\%}$Fe$_{30\,at\%}$(16)/nonmagnetic intermediate sublayer 4b composed of Ru (9.1)/second pinned magnetic sublayer 4c composed of Co$_{90\,at\%}$Fe$_{10\,at\%}$(18)], an insulating barrier layer 5, a free magnetic layer 6 constituted from Fe$_{90\,at\%}$Co$_{10\,at\%}$(10) and Ni$_{86\,at\%}$Fe$_{14\,at\%}$(50), and a protective layer 7 composed of Ru (10) and Ta (190) were stacked in that order from the bottom to form a layered structure T1. Figures in the parenthesis indicate thicknesses in angstrom.

In the experiment, a titanium layer 14 having an average thickness of 5.2 Å was formed on the second pinned magnetic sublayer 4c by sputtering, and a tantalum layer 15 having an average thickness of 0.1 Å, 0.2 Å, 0.3 Å, or 0.4 Å was formed on the titanium layer 14 by sputtering. The titanium layer 14 and the tantalum layer 15 were then radically oxidized. The radical oxidation conditions were electrical power: 100 W to 1,000 W, O$_2$ pressure: 1 to 10 Pa, and oxidation time: 100 to 300 sec.

Four types of layered structures T1 having Ti—Ta—O insulating barrier layers 5 with different Ta concentrations were formed as a result. A layered structure T1 having a Ti—O insulating barrier layer 5 formed by radically oxidizing only a titanium layer 14 having an average thickness of 5.2 Å under the above-described conditions was also prepared. Each layered structure T1 was annealed at 270° C. for 3 hours and 40 minutes.

In the experiment, the rate of change in resistance (ΔR/R) of tunneling magnetic detecting elements including tantalum layers 15 of various average thicknesses was measured. The experimental results are shown in FIG. 10.

Figure 10:
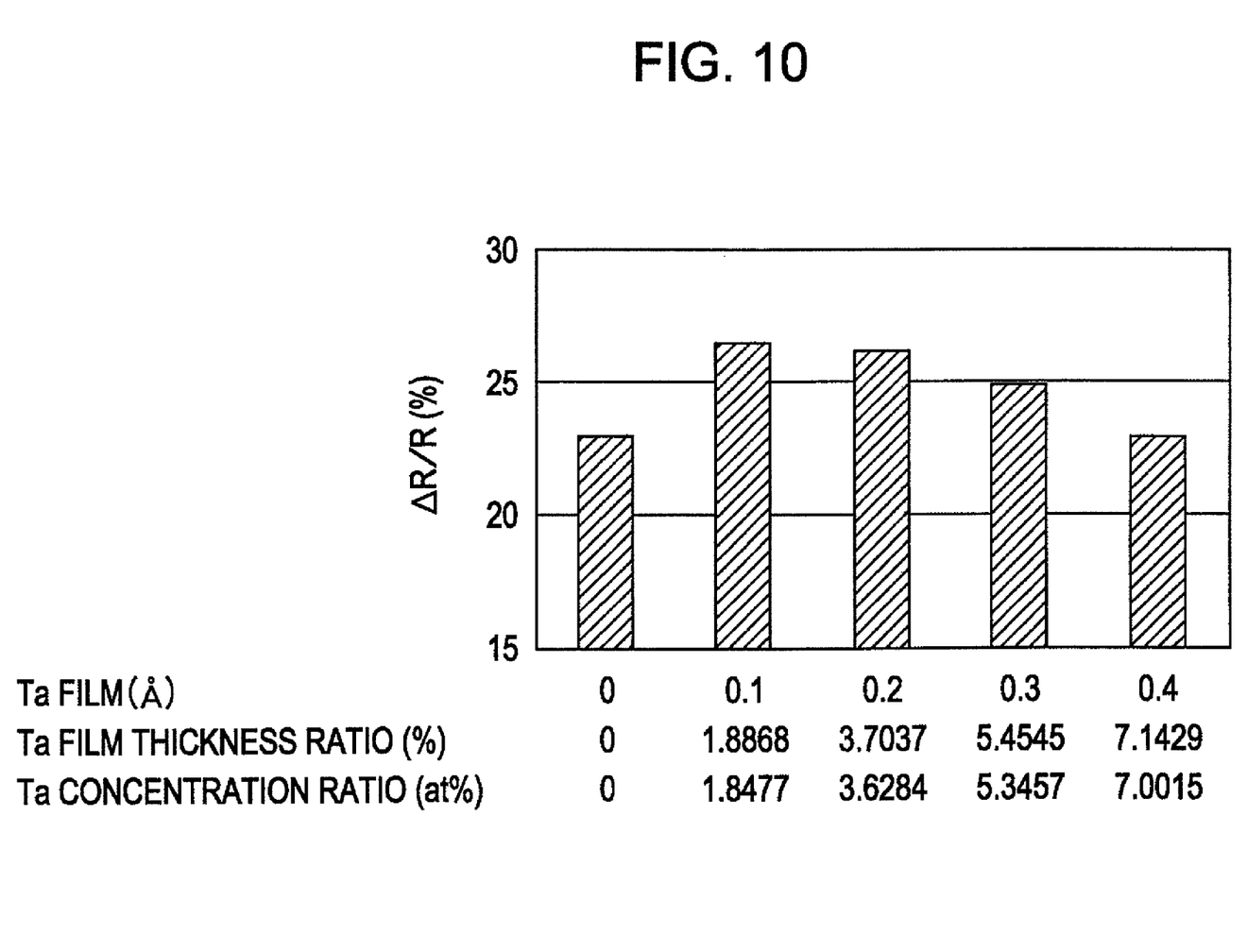
FIG. 10 is a graph showing the rate of change in resistance ($\Delta R/R$) plotted versus the Ta film thickness, the Ta film thickness ratio, and the Ta concentration ratio of five tunneling magnetic detecting elements that respectively include insulating barrier layers formed by oxidizing layered structures of Ti and La having an average thickness of 0.1 Å, 0.2 Å, 0.3 Å, and 0.4 Å, and an insulating barrier layer formed by oxidizing a single layer of Ti.

FIG. 10 shows that a rate of change in resistance (ΔR/R) higher than the rate achieved by the existing technology in which no tantalum layer 15 is formed (thickness of the tantalum layer 15: zero) can be achieved by setting the average thickness of the tantalum layer 15 to more than 0 Å and less than 0.4 Å.

It was also found that RA was within the range of 1 to 2 (Ω·μm$^2$) in all samples.

In FIG. 10, the thickness ratio of the tantalum layer 15, i.e., average thickness of tantalum layer 15/(average thickness of Ta layer+average thickness of Ti layer (5.2 Å))×100(%), and the Ta concentration ratio with respect to a total of 100 at % of Ti and Ta are shown. The Ta density and the Ti density used for converting the thickness ratio to the concentration ratio were 16.65 (g/cm$^3$) and 4.5 (g/cm$^3$), respectively.

As shown in FIG. 10, it was found that a rate of change in resistance (ΔR/R) higher than the rate of the existing technology can be achieved by adjusting the Ta film thickness ratio to more than 0% but not more than 7.14% or the Ta concentration ratio to more than 0 at % but not more than 7 at %.

It was found from the experiment shown in FIG. 10 that a rate of change in resistance (ΔR/R) higher than the rate of the exiting technology can be reliably achieved by setting the average thickness of the tantalum layer 15 to 0.1 Å or more and 0.3 Å or less.

It was also found, as shown in FIG. 10, that a rate of change in resistance (ΔR/R) higher than the rate of the existing technology can be further reliably obtained by adjusting the thickness ratio of the Ta film in the range of 1.89% to 5.45% or the Ta concentration ratio in the range of 1.85 at % to 5.34 at %.

The invention claimed is:

1. A tunneling magnetic detecting element comprising:
   a first magnetic layer;
   an insulating barrier layer on the first magnetic layer; and
   a second magnetic layer on the insulating barrier layer,
   wherein the first magnetic layer, the insulting barrier layer, and the second magnetic layer are stacked in that order from the bottom;
   one of the first magnetic layer and the second magnetic layer functions as a pinned magnetic layer having magnetization pinned in one direction and the other of the first magnetic layer and the second magnetic layer functions as a free magnetic layer having magnetization direction changing in response to an external magnetic field;
   the insulating barrier layer is composed of Ti—Ta—O; and
   the Ta concentration in the barrier layer is more than 0 at % but not more than about 7 at % with respect to a total of 100 at % of Ti and Ta constituting the insulating barrier layer.

2. The tunneling magnetic detecting element according to claim 1, wherein the Ta concentration is about 1.85 at % or more and about 5.34 at % or less.

3. The tunneling magnetic detecting element according to claim 1, wherein the insulating barrier layer has a Ta concentration gradient region therein.

4. The tunneling magnetic detecting element according to claim 1, wherein the insulating barrier layer includes a titanium oxide sublayer and at least one tantalum oxide sublayer formed inside the titanium oxide sublayer, on an upper surface of the titanium oxide sublayer, and/or on a lower surface of the titanium oxide sublayer.

5. The tunneling magnetic detecting element according to claim 4, wherein the tantalum oxide sublayer is intermittently formed on a forming face.

6. The tunneling magnetic detecting element according to claim 1, wherein the insulating barrier layer is formed by oxidizing a Ti—Ta alloy.

7. The tunneling magnetic detecting element according to claim 1, wherein the first magnetic layer is the pinned magnetic layer, the second magnetic layer is the free magnetic layer, and the free magnetic layer includes an enhancing sublayer composed of Co—Fe and a soft magnetic sublayer composed of Ni—Fe, the enhancing sublayer and the soft magnetic sublayer being stacked in that order from the bottom.

8. A method for making a tunneling magnetic detecting element, comprising the steps of:
   (a) forming a layered structure on a first magnetic layer, the layered structure including at least one titanium layer and at least one tantalum layer, such that a ratio of a thickness of the tantalum layer to a total thickness of the layered structure is more than 0% but not more than about 7.14%, the total thickness of the layered structure being a sum of an average thickness of the Ta layer (or a total of average thicknesses of the Ta layers when two or more Ta layers are provided) and an average thickness of the Ti layer (or a total of average thicknesses of the Ti layers when two or more Ti layers are provided);
   (b) forming an insulating barrier layer composed of Ti—Ta—O by oxidizing the at least one Ti layer and the at least one Ta layer; and
   (c) forming a second magnetic layer on the insulating barrier layer.

9. The method according to claim 8, wherein, in step (a), the average thickness of the Ta layer is set to be more than 0 Å and less than about 0.4 Å.

10. The method according to claim 8, wherein, in step (a), the thickness ratio of the Ta layer is set to about 1.89% or more and about 5.45% or less.

11. The method according to claim 10, wherein, in step (a), the average thickness of the Ta layer is set to about 0.1 Å or more and about 0.3 Å or less.

* * * * *